(12) United States Patent
Jun

(10) Patent No.: US 10,790,238 B2
(45) Date of Patent: Sep. 29, 2020

(54) ELECTRONIC DEVICE MODULE AND METHOD OF MANUFACTURING THE SAME

(71) Applicant: Samsung Electro-Mechanics Co., Ltd., Suwon-si (KR)

(72) Inventor: Seok Taek Jun, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/176,240

(22) Filed: Oct. 31, 2018

(65) Prior Publication Data

US 2019/0348372 A1 Nov. 14, 2019

(30) Foreign Application Priority Data

May 10, 2018 (KR) .................. 10-2018-0053427
Jun. 26, 2018 (KR) .................. 10-2018-0073644

(51) Int. Cl.

| | | |
|---|---|---|
| H01L 23/552 | (2006.01) | |
| H01L 23/31 | (2006.01) | |
| H01L 23/538 | (2006.01) | |
| H01L 23/498 | (2006.01) | |
| H01L 25/00 | (2006.01) | |
| H01L 25/16 | (2006.01) | |
| H01L 25/065 | (2006.01) | |

(Continued)

(52) U.S. Cl.
CPC ............ *H01L 23/552* (2013.01); *H01L 21/56* (2013.01); *H01L 23/3121* (2013.01); *H01L 23/49811* (2013.01); *H01L 23/5383* (2013.01); *H01L 23/5386* (2013.01); *H01L 25/0655* (2013.01); *H01L 25/16* (2013.01); *H01L 25/50* (2013.01); *H01L 24/16* (2013.01); *H01L 2224/16227* (2013.01); *H01L 2924/19042* (2013.01); *H01L 2924/19105* (2013.01); *H01L 2924/3025* (2013.01)

(58) Field of Classification Search
None
See application file for complete search history.

(56) References Cited

U.S. PATENT DOCUMENTS 8,247,889 B2   8/2012   Liao et al.
9,144,183 B2   9/2015   Chen et al.
(Continued)

FOREIGN PATENT DOCUMENTS

| CN | 102709274 A | 10/2012 |
|---|---|---|
| JP | 2017-212377 A | 11/2017 |
| JP | 2018-26825 A | 2/2018 |

*Primary Examiner* — Long Pham
(74) *Attorney, Agent, or Firm* — NSIP Law

(57) ABSTRACT

An electronic device module includes a substrate, at least one first component and at least one second component disposed on one surface of the substrate, a first sealing portion sealing the at least one first component and a second sealing portion sealing the at least one second component, a shielding wall disposed between the at least one first component and the at least one second component to block a flow of electromagnetic waves, and a shielding layer of a conductive material disposed along a surface formed by the first and second sealing portions and the shielding wall. The shielding wall includes a first wall and a second wall spaced apart from each other, and the shielding layer is partially formed on opposing surfaces of the first wall and the second wall.

20 Claims, 9 Drawing Sheets

(51) Int. Cl.
*H01L 21/56* (2006.01)
*H01L 23/00* (2006.01)

(56) References Cited

U.S. PATENT DOCUMENTS

2017/0345793 A1* 11/2017 Miyairi .................. H01L 24/02
2019/0115305 A1* 4/2019 Lin, Jr. .................. H01L 25/18

* cited by examiner

ELECTRONIC DEVICE MODULE AND METHOD OF MANUFACTURING THE SAME

CROSS-REFERENCE TO RELATED APPLICATIONS

This application claims the benefit under 35 USC 119(a) of Korean Patent Application Nos. 10-2018-0053427 filed on May 10, 2018, and 10-2018-0073644 filed on Jun. 26, 2018, in the Korean Intellectual Property Office, the entire disclosures of which are incorporated herein by reference for all purposes.

BACKGROUND

1. Field

This application relates to an electronic device module and a method of manufacturing the same, and more particularly, to an electronic device module in which a passive component, a semiconductor chip, or the like, included in a module, may be protected from an external environment while electromagnetic waves are able to be blocked, and a method of manufacturing the same.

2. Description of the Background

Recently, in the electronic products market, consumption of portable electronic products has increased rapidly, and accordingly, there has been demand for small, lightweight electronic components for use in portable electronic product systems.

To achieve this, it has been necessary to use a technique for reducing the sizes of individual components, in addition to a system-on-chip (SOC) technique which integrates individual components into a single chip, or a system-in-package (SIP) technique which integrates individual components into a single package.

Particularly, in the case of a high frequency electronic device module using a high frequency signal, such as a communications module or a network module, it has been necessary to provide electromagnetic wave shielding structures having various forms, to successfully implement shielding properties in relation to electromagnetic wave interference, along with miniaturization.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an electronic device module includes a substrate, at least one first component and at least one second component disposed on one surface of the substrate, a first sealing portion sealing the at least one first component and a second sealing portion sealing the at least one second component, a shielding wall disposed between the at least one first component and the at least one second component to block a flow of electromagnetic waves, and a shielding layer of a conductive material disposed along a surface formed by the first and second sealing portions and the shielding wall. The shielding wall includes a first wall and a second wall spaced apart from each other, and the shielding layer is partially formed on opposing surfaces of the first wall and the second wall.

The substrate may have a ground layer exposed to a side surface of the substrate, and the shielding layer may be extended to the side surface of the substrate and connected to the ground layer.

The substrate may have connection electrodes on the one surface, and the shielding wall may be disposed on an upper portion of the connection electrodes.

The substrate may further include a ground via connecting the connection electrodes and the ground layer.

The ground via may include a plurality of ground vias disposed along the shielding wall in parallel.

The electronic device module may further include a connection conductor disposed between the connection electrodes and the shielding wall.

Both the first wall and the second wall may be connected to one of the connection electrodes.

The first wall and the second wall may be spaced apart from each other by a distance ranging from 20 μm to 300 μm.

Thicknesses of the first wall and the second wall may be greater than a thickness of the shielding layer.

The shielding layer may include a material different from a material of the shielding wall.

In another general aspect, an electronic device module includes a substrate, and a shielding wall disposed on a surface of the substrate to divide the surface into a first region and a second region and configured to block a flow of electromagnetic waves. The shielding wall includes a first wall and a second wall spaced apart from each other to space the first region apart from the second region.

The electronic device module may further include at least one first component and at least one second component disposed on the surface of the substrate in the first region and the second region, respectively, a first sealing portion sealing the at least one first component and a second sealing portion sealing the at least one second component, and a shielding layer of a conductive material disposed along a surface formed by the sealing portions and the shielding wall. The shielding wall may be partially exposed externally of the shielding layer on opposing surfaces of the first wall and the second wall.

The first wall may be integrated with the first sealing portion, and the second wall may be integrated with the second sealing portion.

The electronic device module may further include a first sealing portion sealing the first region and a second sealing portion sealing the second region, and a shielding layer of a conductive material disposed along a surface formed by the sealing portions and the shielding wall. The shielding wall may be partially exposed externally of the shielding layer on opposing surfaces of the first wall and the second wall.

In another general aspect, a method of manufacturing an electronic device module includes disposing a first component and a second component on one surface of a substrate, disposing a conductive member between the first component and the second component, and dividing a first wall and a second wall by cutting the conductive member.

The disposing a conductive member may include forming a sealing portion sealing the first component and the second component on the one surface of the substrate, forming a trench by partially removing the sealing portion, and forming the conductive member by filling the trench with a conductive material.

The method of manufacturing an electronic device module may further include forming a shielding layer on a surface formed by the sealing portion, the first wall, and the second wall.

The disposing a conductive member may include mounting a conductive member in a form of a metal frame between the first component and the second component, and forming a sealing portion sealing the first component, the second component, and the conductive member on the one surface of the substrate.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
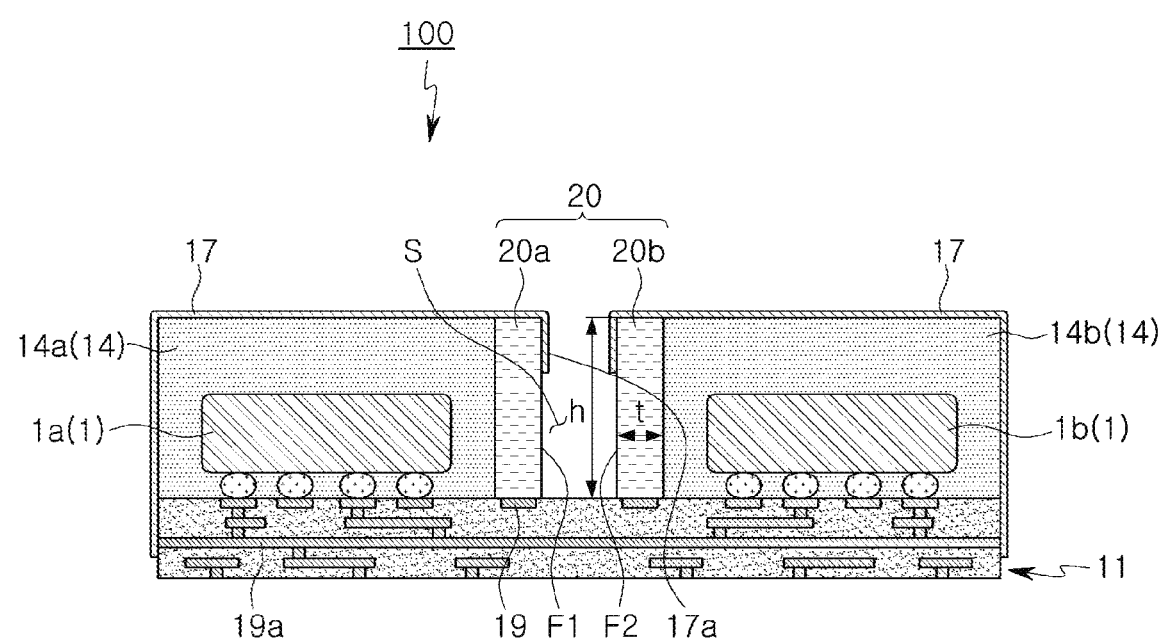
FIG. 1 is a cross-sectional view of an electronic device module according to one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application. Hereinafter, while embodiments of the present disclosure will be described in detail with reference to the accompanying drawings, it is noted that examples are not limited to the same.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Herein, it is noted that use of the term "may" with respect to an example, for example, as to what an example may include or implement, refers to at least one example in which such a feature is included or implemented while all examples are not limited thereto.

An aspect of the present disclosure may provide an electronic device module including internal components able to be protected from impact and an electromagnetic wave shielding structure having excellent electromagnetic wave interference resistance properties and/or electromagnetic wave resistance properties, and a method of manufacturing the same.

FIG. 1 is a cross-sectional view of an electronic device module according to one or more embodiments.

Referring to FIG. 1, an electronic device module 100 according to an example may include a substrate 11, electronic components 1, a sealing portion 14, a shielding wall 20, and a shielding layer 17.

On a first surface of the substrate 11, mounting electrodes for mounting the electronic components 1, a connection electrode 19, and, although not illustrated, a wiring pattern in which the mounting electrodes are electrically connected to each other, may be formed.

At least one electronic component 1 may be mounted on the mounting electrode.

The connection electrode 19 may be an electrode to which the shielding wall 20 is connected, and may thus be electrically connected to the shielding wall 20. Although not illustrated, in the example, the connection electrode 19 may be connected to a ground of the substrate 11. Thus, the connection electrode 19 may be electrically connected to ground terminals of the electronic components 1, and a ground layer 19a.

In the example, the connection electrode 19 may be disposed between a first component 1a of the electronic components 1 and a second component 1b of the electronic components 1, and may be formed in solid line form along a shape of the shielding wall 20.

The connection electrode 19 may be formed as a solid line in the example, but is not limited thereto. The connection electrode 19 may be formed in various manners as long as the connection electrode 19 is able to be electrically connected to the shielding wall 20. For example, the connection electrode 19 may be formed as a broken line or a dotted line.

In the example, two of the shielding walls 20 may be spaced apart from each other, side by side in parallel. Accordingly, two of the connection electrodes 19 may be spaced apart from each other side by side in parallel along the position of the shielding walls 20. However, embodiments thereof are not limited thereto.

Meanwhile, although not illustrated in detail, the mounting electrode or the connection electrode 19 may be protected by a protective insulation layer (not illustrated) disposed on an upper portion in layers, and may be exposed externally through an opening formed in the protective insulation layer. As the protective insulation layer, a solder resist may be used, but is not limited thereto.

Also, the ground layer 19a may be disposed inside the substrate 11. The ground layer 19a may be exposed externally of the substrate 11 through a side surface of the substrate 11, and may be electrically connected to the shielding layer 17.

The substrate 11 may be implemented by various types of circuit substrates (e.g., a ceramic substrate, a printing circuit substrate, a flexible substrate, and the like) generally used in the respective technical field. The substrate 11 according to the example may be a multilayer substrate 11 having a plurality of layers, and a circuit pattern may be formed between the layers.

The electronic components 1 may include a variety of electronic devices such as a passive device and an active device. In other words, the electronic components 1 may be implemented by any electronic components able to be mounted on or inside the substrate 11.

Also, the electronic components 1 in the examples may include at least one first component 1a embedded in a first sealing portion 14a and at least one second component 1b embedded in a second sealing portion 14b. The first component 1a and the second component 1b may be implemented by devices between which electrical interference occurs. However, embodiments thereof are not limited thereto.

For example, the first component 1a and the second component 1b may be implemented by active devices. However, embodiments thereof are not limited thereto. For example, it may be possible to implement the first component 1a by an active device and implement the second component 1b by a passive device such as an inductor.

The sealing portion 14 may be disposed on the first surface of the substrate 11 and seal the electronic components 1. The sealing portion 14 may fix the electronic components 1 by sealing the components externally, thereby protecting the electronic components 1 safely from external impacts.

The sealing portion 14 according to the example may be formed of an insulation material. For example, the sealing portion 14 may be formed of a resin material such as an epoxy molding compound (EMC), but is not limited thereto. Also, if necessary, the sealing portion 14 may be formed of a conductive material (e.g., a conductive resin, and the like). In this case, an individual sealing member, such as an underfill resin, may be provided between the electronic components 1 and the substrate 11.

In the examples, the sealing portion 14 may be divided into the first sealing portion 14a and the second sealing portion 14b by the shielding wall 20. The shielding wall 20 may include a first wall 20a and a second wall 20b. The first sealing portion 14a may have the first component 1a embedded therein, and may be integrated with the first wall 20a. The second sealing portion 14b may have the second component 1b embedded therein, and may be integrated with the second wall 20b.

The shielding wall 20 may be disposed between the first component 1a and the second component 1b, and block electromagnetic waves flowing into the second component 1b from the first component 1a or flowing into the first component 1a from the second component 1b.

Thus, the shielding wall 20 may be formed of a conductive material, and may be disposed on an upper portion of the connection electrode 19 on the substrate 11 and be electrically connected to the connection electrode 19. For example, the shielding wall 20 may be a planar metal plate and formed of a material capable of shielding electromagnetic waves, such as copper, solder, or conductive resin, and may be connected to the connection electrode 19 on the substrate 11.

A thickness (t in FIG. 1) of the shielding wall 20 may be configured to be different from that of the shielding layer 17. For example, a thickness of the shielding wall 20 may be configured to be greater than that of the shielding layer 17.

A mounting height (h) of the shielding wall 20 may be substantially equal to a height of the sealing portion 14. Accordingly, an upper end surface of the shielding wall 20 may be exposed externally of the sealing portion 14, and the shielding layer 17 may be disposed on the partially exposed upper end of the shielding wall 20.

Also, the shielding wall 20 may include the first wall 20a and the second wall 20b. Both the first wall 20a and the second wall 20b may be disposed between the first component 1a and the second component 1b, and may be spaced apart from each other. For example, the spaced distance between the first wall 20a and the second wall 20b may be within a range of 20 µm to 300 µm, and a gap between the first wall 20a and the second wall 20b may be formed as a space S. For example, the gap may be an empty space such as an air gap or filled with an ambient environment (e.g., gas, liquid, vacuum) in which the electronic device module 100 may be disposed. In an alternative example, the gap may include additional material such as an electrically insulative and/or a conductive material, for example, in the form of a third wall spaced apart from the first wall 20a and the second wall 20b.

The first wall 20a and the second wall 20b may be formed of the same material, and thicknesses of the first wall 20a and the second wall 20b may be substantially equal or similar. Also, areas (F1 and F2; hereinafter, opposing surfaces) of the first wall 20a and the second wall 20b, opposing each other, may be configured to be about the same size.

The shielding layer 17 may be formed along a surface formed by the sealing portion 14 and the shielding wall 20, and block electromagnetic waves flowing into the electronic component 1 from the outside or leaking from the electronic component 1 to the outside. Thus, the shielding layer 17 may be formed of a conductive material.

In the example, the shielding layer 17 may be extended to a side surface of the substrate 11 from surfaces of the first sealing portion 14a and the second sealing portion 14b. Accordingly, the shielding layer 17 may be electrically connected to the ground layer 19a exposed to the side surface of the substrate 11.

The shielding layer 17 may be formed by coating an external surface of the sealing portion 14 with a resin material including a conductive powder or by forming a metal thin film. In the case of forming a metal thin film, various methods, such as a sputtering method, a screen printing method, a vapor deposition method, an electroplating process, an electroless plating process, and the like, may be used.

For example, the shielding wall 17 may be a metal thin film formed on an external surface of the sealing portion 14 by a spray coating method. By the spray coating method, an evenly coated film may be formed, and costs, in terms of infrastructure investment, may be relatively lower than other processes. However, embodiments thereof are not limited thereto.

As the shielding layer 17 is formed in a form of a metal thin film, a thickness of the shielding layer 17 may be lower than that of the shielding wall 20. For example, a thickness of the shielding wall 20 may be twice a thickness of the shielding layer 17 or greater, but is not limited thereto.

The shielding layer 17 may be physically and electronically connected to the shielding wall 20. The shielding layer 17 may be electronically connected to the shielding wall 20 through an upper surface of the shielding wall 20 exposed to an upper surface of the sealing portion 14.

In the case in which the shielding layer 17 is connected to the shielding wall 20 as above, in one of the shielding layer 17 and the shielding wall 20, connection to the connection electrode 19 or to the ground layer 19a may be omitted. In this case, one of the connection electrode 19 or the ground layer 19a may be omitted on the substrate 11.

However, embodiments thereof are not limited thereto. The shielding layer 17 and the shielding wall 20 may be indirectly connected to each other through the ground layer 19a and the ground electrode 19 on the substrate 11, not being directly connected to each other, or other various modifications may be possible.

The shielding layer 17 in the examples may be partially disposed on the opposing surfaces F1 and F2 of the first wall 20a and the second wall 20b.

In the examples, as the spaced distance between the first wall 20a and the second wall 20b is within a range of 20 µm to 300 µm, the space S between the shielding walls 20a and 20b may be relatively narrow. Thus, in the case of forming the shielding layer 17 using a spray coating method, it may be difficult for a conductive material forming the shielding layer 17 to flow into the space S between the shielding walls 20a and 20b.

Accordingly, the shielding layer 17 may not be formed on overall areas of the opposing surfaces F1 and F2 of the shielding walls 20a and 20b, but may only be partially formed on upper ends of the shielding walls 20a and 20b on the opposing surfaces F1 and F2.

However, as the shielding walls 20a and 20b are formed of a conductive material, although the shielding layer 17A is not formed on the overall areas of the opposing surfaces F1 and F2, electromagnetic wave interference (EMI) between the electronic components 1a and 1b may be blocked through the shielding walls 20a and 20b.

The electronic device module configured as above according to the examples may include a shielding structure comprised of the ground layer 19a, the shielding layer 17, the shielding wall 20, and the connection electrode 19. The shielding structure may be configured to completely seal the electronic components 1 positioned in the shielding structure, and thus, electromagnetic wave interference from the outside may be blocked effectively.

Also, in the electronic device module according to the examples, the sealing portion 14 may be divided into two portions by the shielding wall 20, and the empty space S may be formed between the first wall 20a and the second wall 20b. Accordingly, degradation of mechanical properties occurring during contraction/expansion of the shielding wall 20 and the sealing portion 14 may be significantly reduced.

As the sealing portion 14 is formed of a resin material or a polymer material having insulation properties, and the shielding wall 20 is formed of a metal material having conductive properties, there may be a significant difference between thermal expansion coefficients of the sealing portion 14 and the shielding wall 20. Thus, in the case in which the sealing portion is configured as a single body, and only one shielding wall is disposed in the sealing portion 14, stress on an interfacial surface between the sealing portion and the shielding wall may increase due to the difference in thermal expansion coefficients. The increase of stress may lead to damage of the electronic device module.

However, in the electronic device module in the examples, the sealing portion 14 may be divided into two portions using the shielding wall 20. Accordingly, a volume of the sealing portion 14 may be reduced, and the stress between the sealing portion 14 and the shielding wall 20 may be decreased.

Also, the empty space S is disposed between the sealing portions 14a and 14b, when the sealing portion 14 or the shielding wall 20 is thermally expanded, the volume may be expanded to the empty space S. Accordingly, the damage of the electronic device module caused by thermal expansion may be significantly reduced.

Meanwhile, the electronic device module may be configured to only include the shielding layer 17. In this case, the shielding layer 17 may need to be disposed on the two opposing surfaces of the first sealing portion 14a and the second sealing portion 14b.

However, in the case in which a gap between the first sealing portion 14a and the second sealing portion 14b is small, it may be difficult for a conductive material to be flowed between the first sealing portion 14a and the second sealing portion 14b during the process of forming the shielding layer 17. Thus, to evenly form the shielding layer 17 on the overall areas of the opposing surfaces of the first sealing portion 14a and the second sealing portion 14b, the gap between the first sealing portion 14a and the second sealing portion 14b may need to be expanded.

However, in the case of using the shielding wall 20 as in the examples, the first wall 20a and the second wall 20b may be disposed on the two opposing surfaces of the first sealing portion 14a and the second sealing portion 14b, respectively. Thus, it may not be necessary to consider whether the shielding layer 17 is formed on the overall areas of the two opposing surfaces of the first sealing portion 14a and the second sealing portion 14b, and accordingly, there may be no need to expand the gap between the first sealing portion 14a and the second sealing portion 14b.

Thus, in the electronic device module according to the example, an overall size of the electronic device module may be reduced, as compared to the case in which the shielding wall 20 is omitted, and shielding reliability between the first component 1a and the second component 1b may also be improved.

In the description below, a method of manufacturing an electronic device module according to one or more examples will be described.

Figure 2:
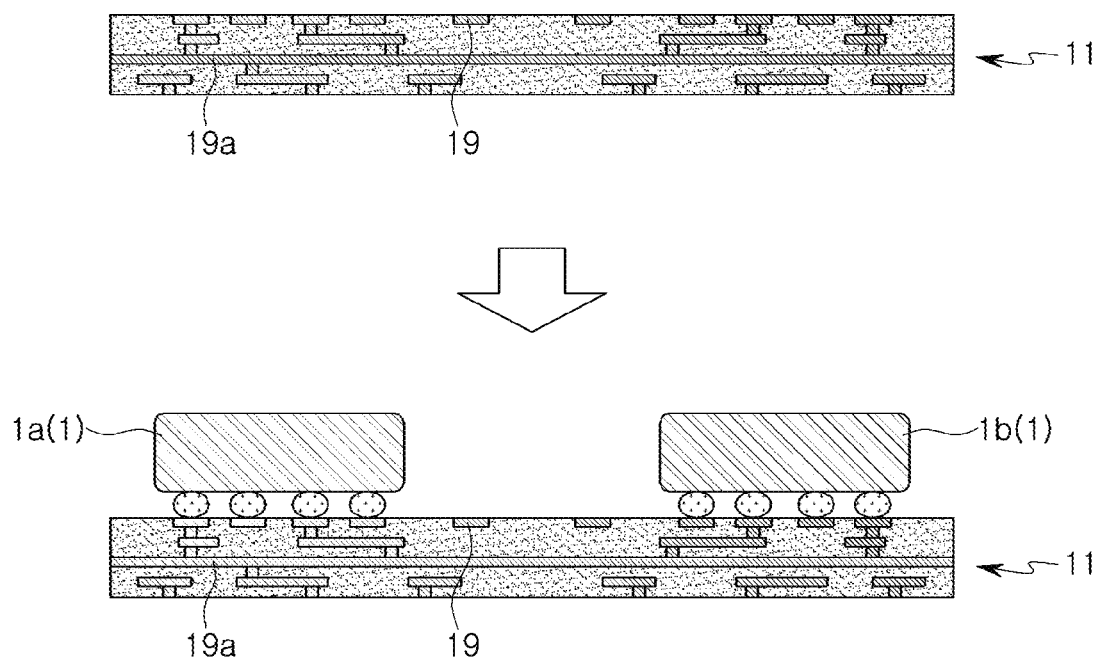
FIGS. 2, 3, and 4 are views illustrating processes in one or more example methods of manufacturing an electronic device module in order.
Figure 3:
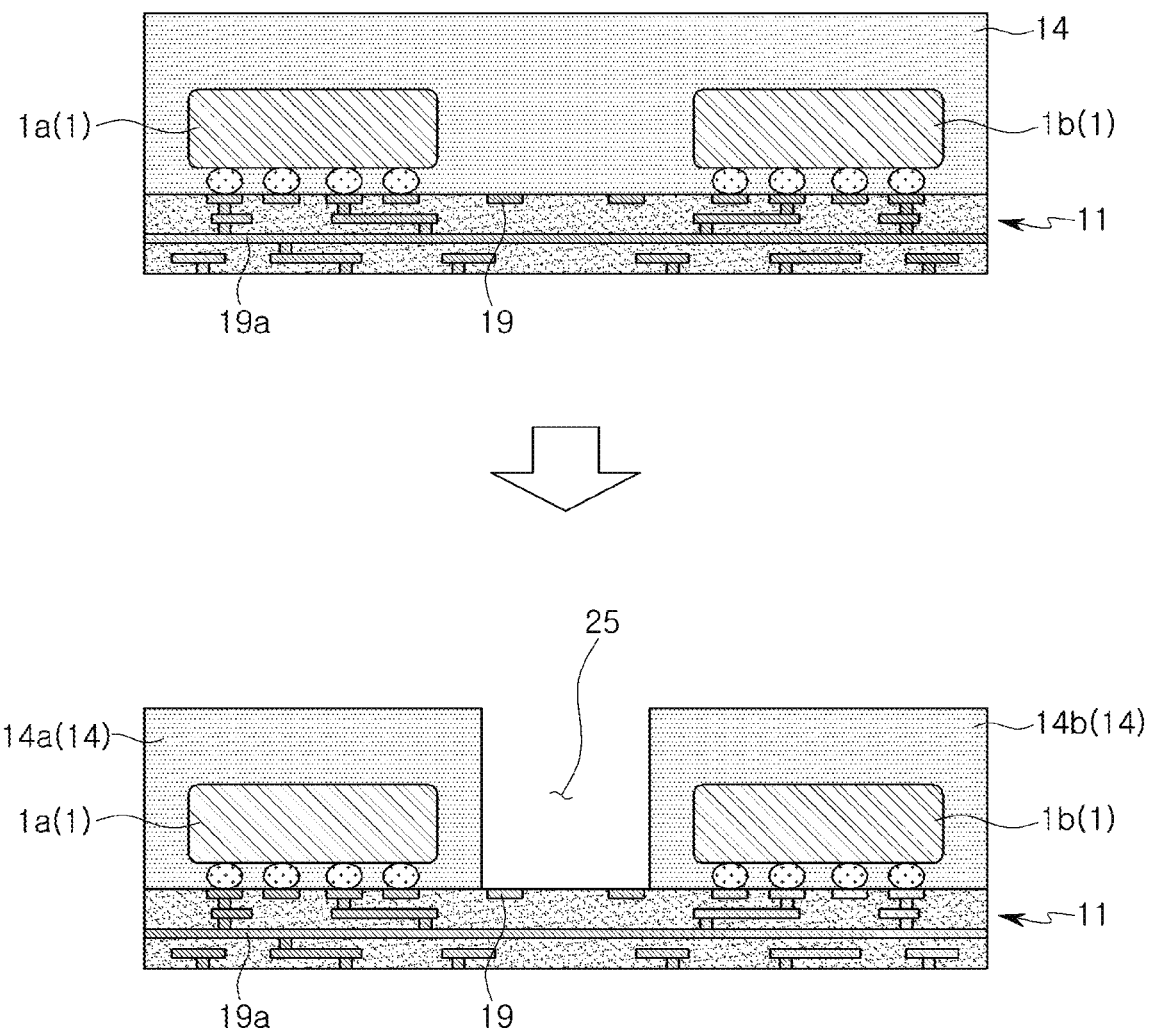
Figure 4:
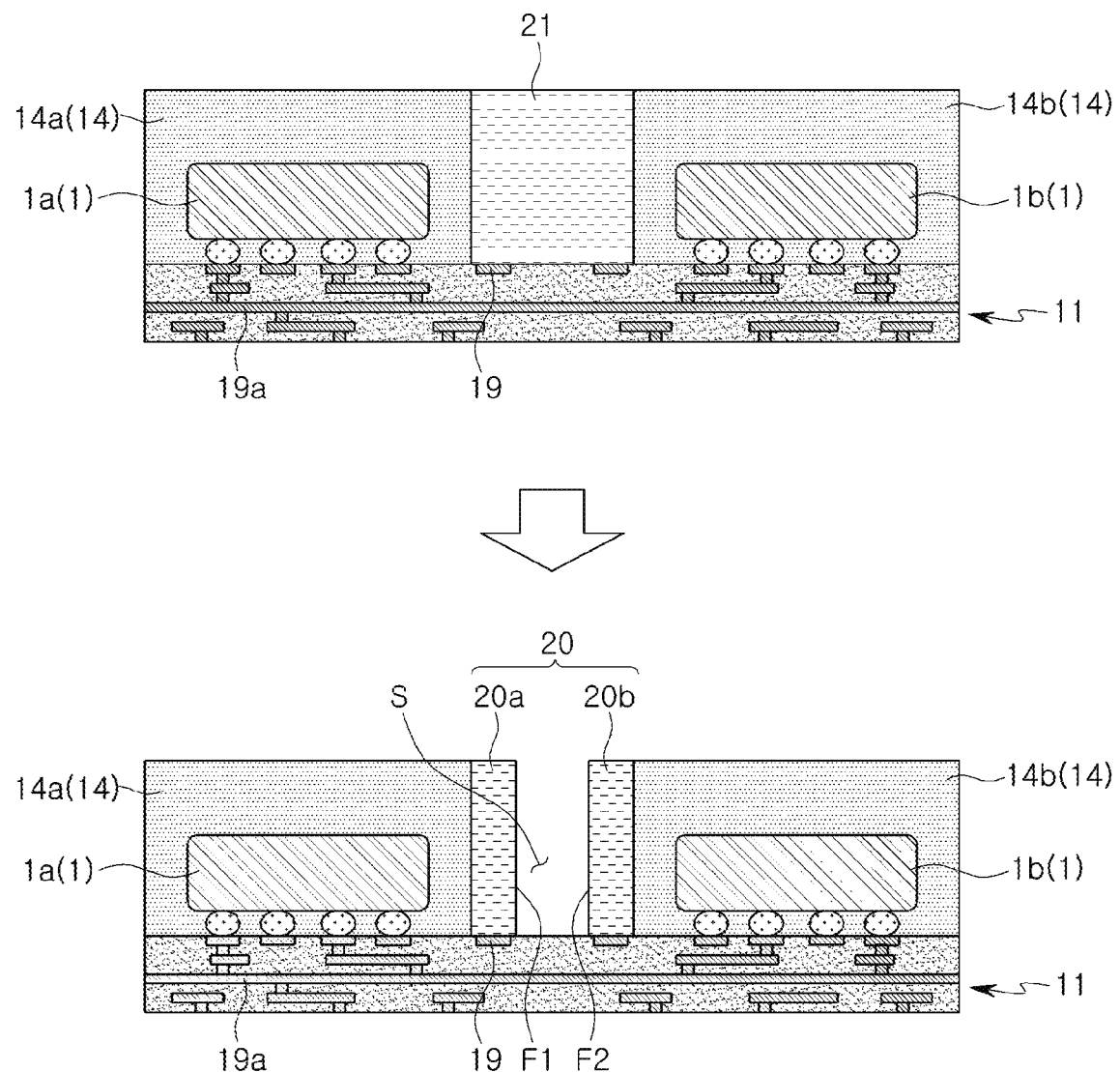

FIGS. 2 to 4 are views illustrating processes in one or more example methods of manufacturing an electronic device module in order. For example, the one or more example methods described herein may be used to manufacture one or more example electronic device modules as shown in FIG. 1.

As illustrated in FIG. 2, a substrate 11 including a connection electrode 19 and a ground layer 19a may be prepared. The substrate 11 according to the examples may be a multilayer circuit substrate having a plurality of layers, and electrically connected circuit patterns may be formed between the layers, and the substrate 11 may include at least one ground layer 19a.

At least one connection electrode 19 may be provided in one surface of the substrate 11. The connection electrode 19 may be formed in the process of manufacturing the substrate 11, but embodiments thereof are not limited thereto. The connection electrode 19 may be formed on the substrate 11 through a separate process after preparing the substrate 11.

In the examples, the connection electrode 19 may be electrically connected to the ground layer 19a. However, embodiments thereof are not limited thereto.

Then, the electronic components 1 may be mounted on a first surface of the substrate 11.

The electronic components 1 may be connected to a mounting electrode for mounting the electronic components 1 on the substrate 11 by means of a conductive adhesive agent such as a solder.

Thereafter, as illustrated in FIG. 3, a sealing portion 14 sealing the electronic components 1 may be formed on the first surface of the substrate 11.

The sealing portion 14 may be formed on an overall area of the first surface of the substrate 11. Thus, the electronic components 1, mounted on the substrate 11, may be embedded in the sealing portion 14. In this process, the sealing portion 14 may be manufactured by a transfer molding method, but embodiments thereof are not limited thereto. Also, in the examples, the example in which the electronic components 1 are completely embedded in the sealing portion 14 is suggested, but if necessary, the sealing portion 14 may be configured such that a part of the electronic components 1 is exposed externally of the sealing portion 14, or other various modifications may be possible.

Then, a trench 25 may be formed by partially removing the sealing portion 14. By the trench 25, the sealing portion 14 may be divided into a first sealing portion 14a and a second sealing portion 14b, and the first component 1a and the second component 1b may be disposed in the first sealing portion 14a and the second sealing portion 14b, respectively.

In the process of forming the trench 25, a method of sawing using a laser or a blade may be used, but embodiments thereof are not limited thereto. Also, in this process, the sealing portion 14 may be removed until the connection electrode 19 on the substrate 11 is exposed.

As a following step, a conductive member 21 may be disposed in the trench 25 as illustrated in FIG. 4. The conductive member 21 may be formed by filling the trench 25 with a conductive paste, and melting and hardening the paste. However, embodiments thereof are not limited thereto. The conductive member 21 may be formed by filling the trench 25 with a conductive material through a plating process, or various other modifications may be possible.

In the examples, the shielding wall 20 may be formed by filling the trench with a conductive resin (e.g., a conductive epoxy). However, embodiments thereof are not limited thereto. As the conductive material, various conductive materials such as a solder, copper, and the like, may be used.

Thereafter, the shielding wall 20 may be divided into a first wall 20a and a second wall 20b by cutting the conductive member 21. In this process, a method of sawing using a laser or a blade may be used as above, but embodiments thereof are not limited thereto.

In this process, a central portion of the shielding wall 20 may be removed in an amount of 20 μm to 300 μm in width. Accordingly, an empty space having a width of 20 μm to 300 μm may be formed between the first wall 20a and the second wall 20b.

Then, the shielding layer 17 may be formed, and the electronic device module 100 in FIG. 1 may be manufactured.

The shielding layer 17 may be formed by coating an external surface of the sealing portion 14 with a conductive material. As described above, as a conductive material, a resin material may be used. Also, the shielding layer 17 may be formed in a form of a metal thin layer. In the case of forming a metal thin film, various methods, such as a sputtering method, a screen printing method, a vapor deposition method, an electroplating process, an electroless plating process, and the like, may be used.

The shielding layer 17 may be formed on a side surface of the substrate 11 and electrically connected to the ground layer 19a exposed to the side surface of the substrate 11.

Also, the shielding layer 17 in the examples may be formed on an overall surface of the sealing portion 14 and an overall area of an upper surface of the shielding wall 20, and may be partially formed on opposing surfaces F1 and F2 of the shielding wall 20.

The shielding layer 17 may be configured as above because, as the spaced distance between the first wall 20a and the second wall 20b is between 20 μm to 300 μm, it may be difficult for a conductive material forming the shielding layer 17 to flow into the space S between the first wall 20a and the second wall 20b.

Accordingly, the shielding layer 17A may not be formed on entire areas of the opposing surfaces F1 and F2 of the shielding walls 20a and 20b, but may be partially formed in upper portions of the shielding walls 20a and 20b on the opposing surfaces F1 and F2. Also, the shielding layers 17a formed on the opposing surfaces F1 and F2 may have a higher density towards upper ends of the opposing surfaces F1 and F2, and have a lower density towards lower ends of the opposing surfaces F1 and F2.

In the examples, the example in which a connection electrode 19 is electrically connected to the ground layer 19a is suggested, but embodiments thereof are not limited thereto. For example, the connection electrode 19 may be a dummy electrode which is not connected to other wirings of the substrate 11. In this case, the shielding wall 20 may be electrically connected to a ground of the substrate 11 through the shielding layer 17 and the ground layer 19a, and the connection electrode 19 may only have a function of connecting the shielding wall 20 to the substrate 11.

Also, the connection electrode 19 may be omitted if necessary. In this case, the shielding wall 20 may be connected to an insulation layer, not to an electrode on the substrate 11, by means of an insulation adhesive agent or a conductive adhesive agent.

The electronic device module according to an example thereof is not limited to the aforementioned examples, and various modifications may be possible.

Figure 5:
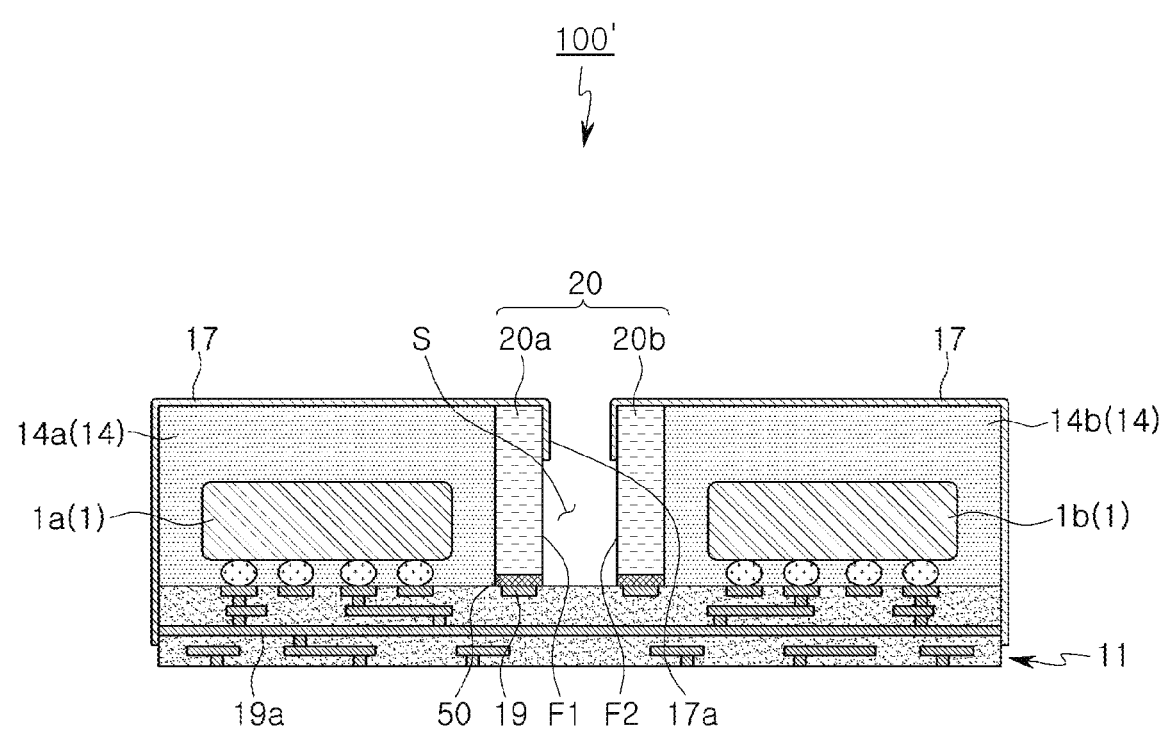
FIG. 5 is a cross-sectional view of an electronic device module according to one or more embodiments.

FIG. 5 is a cross-sectional view of an electronic device module according to another example.

Referring to FIG. 5, in the electronic device module according to one or more embodiments, a connection conductor 50 may be disposed between a shielding wall 20 and a connection electrode 19. Thus, the shielding wall 20 may be connected to the connection electrode 19 by means of the connection conductor 50.

The connection conductor 50 may be formed by a conductive adhesive agent such as a solder or a conductive epoxy.

The shielding wall 20 in the example may be provided in a form of an individually manufactured metal frame, and may be mounted on the substrate 11 through the connection conductor 50. Thus, the shielding wall 20 may be spaced apart from the substrate 11 by a certain distance, and may be electrically connected to the connection electrode 19 through the connection conductor 50. Thus, the connection conductor 50 may space the shielding wall 20 apart from the substrate 11 and block electromagnetic waves at the lower end of the shielding wall 20.

The connection conductor 50 may be formed by coating a surface of the connection electrode 19 with copper (Cu), silver (Ag), and the like, in a form of a paste, and hardening the paste. However, embodiments thereof are not limited thereto. The connection conductor 50 may also be formed by a method such as a plating process, and the like.

In the description below, a method of manufacturing an electronic device module will be described.

Figure 6:
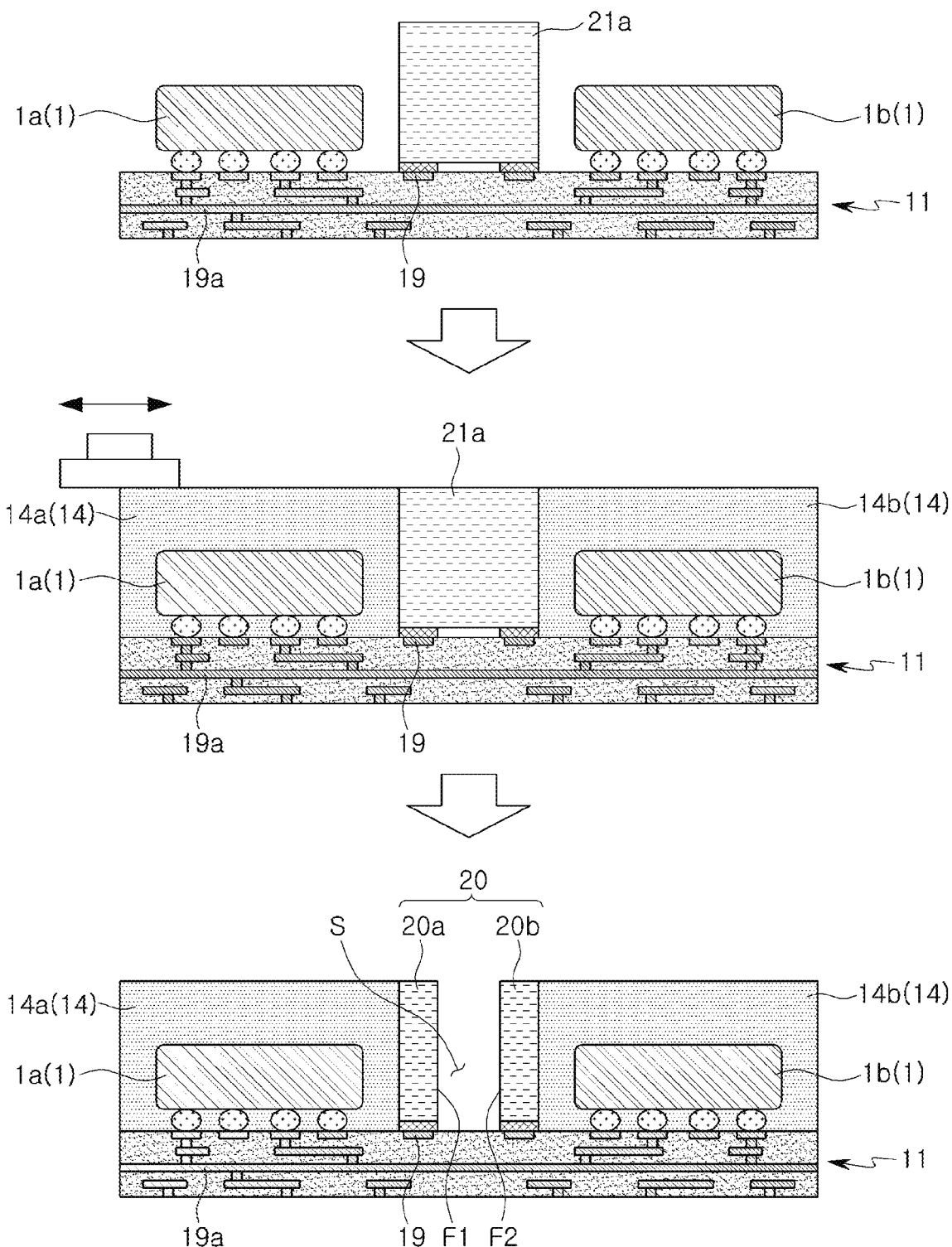
FIG. 6 is a view illustrating processes in one or more examples of methods of manufacturing an electronic device module in order.

FIG. 6 is a view illustrating one or more examples of methods of manufacturing an electronic device module, for example, as shown in FIG. 5.

Referring to FIG. 6, a conductive member may be manufactured in a form of a metal frame, and mounted on a substrate 11 along with electronic components 1. The conductive member 21a having a form of a metal frame may have a shape substantially identical or similar to that of the conductive member 21 formed inside the trench 25 in FIG. 4. However, embodiments thereof are not limited thereto.

Then, the sealing portion 14 sealing a conductive member 21a and the electronic components 1 may be formed on the substrate 11. The conductive member 21a may be completely embedded in the sealing portion 14 along with the electronic components 1.

Thereafter, an upper surface of the sealing portion 14 may be ground to allow an upper surface of the conductive member 21a to be exposed to the outside. Then, a first wall 20a and a second wall 20b may be formed by cutting the conductive member 21a.

Then, a shielding layer 17 may be formed on surfaces of the sealing portion 14 and the shielding wall 20, and the example electronic device module 100' in FIG. 5 may be manufactured.

Meanwhile, in the examples, the example in which the first wall 20a and the second wall 20b are formed by cutting one conductive member 21a is suggested, but embodiments thereof are not limited thereto. It may be possible to prepare the first wall 20a and the second wall 20b in a form of a metal frame and mount the first wall 20a and the second wall 20b on the substrate 11. In this case, the sealing portion 14 may be disposed between the first wall 20a and the second wall 20b, and thus, a process of removing the sealing portion 14 may be additionally performed.

Figure 7:
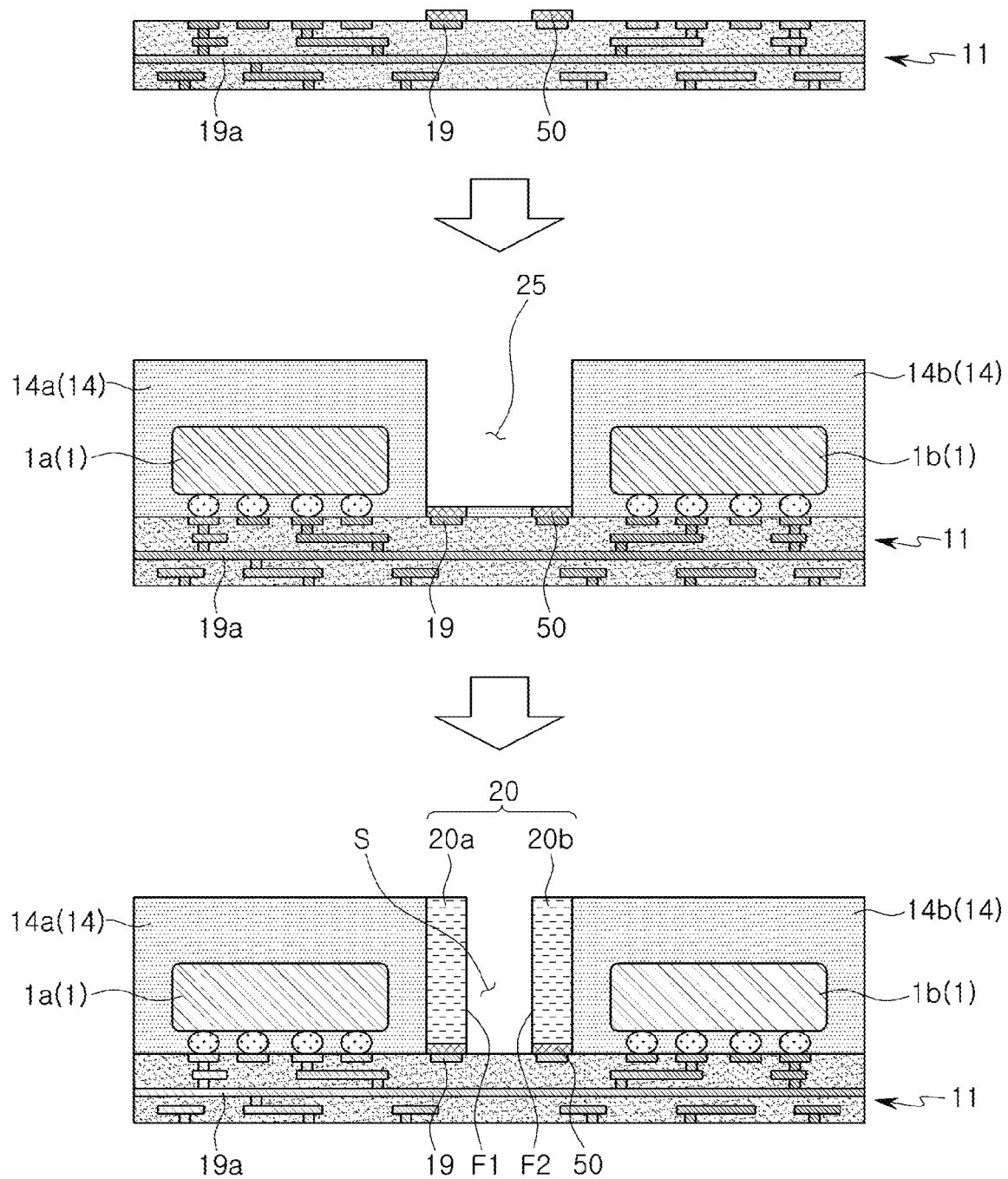
FIG. 7 is a view illustrating one or more examples of methods of manufacturing an electronic device module.

FIG. 7 is a view illustrating one or more examples of methods of manufacturing an electronic device module.

Referring to FIG. 7, a connection conductor 50 may be formed on a connection electrode 19 on a substrate 11.

The connection conductor 50 may be formed by disposing a conductive material on the connection electrode 19. The conductive material may electrically connect the connection electrode 19 with the shielding wall 20, and various materials capable of bonding the connection electrode 19 with the shielding wall 20 may be used as the conductive material. For example, the connection conductor 50 may be formed by applying copper (Cu), silver (Ag) and the like, to the connection electrode 19 in a form of a paste and hardening the paste, but embodiments thereof are not limited thereto. The connection conductor 50 may be formed by a plating method, and the like, or various other modifications may be possible.

Thereafter, a process of mounting the electronic components 1 and forming the sealing portion 14 on the substrate 11, and a process of forming a trench 25 on the sealing portion 14 may be undertaken sequentially.

In the process of forming the trench 25, a method of sawing using a laser or a blade may be used, but embodiments thereof are not limited thereto. Also, in this process, the sealing portion 14 may be removed until the connection conductor 50 is exposed. Thus, a laser or a blade may not be in contact with the substrate, and damage to the substrate caused by a laser or a blade may accordingly be prevented.

Then, after disposing a conductive member 21 in the trench 25, the shielding wall 20 may be divided into the first wall 20a and the second wall 20b by cutting the conductive member 21. This process may be undertaken as in the aforementioned example.

Accordingly, the first wall 20a and the second wall 20b may be connected to the connection conductor 50, and connected to the connection electrode 19 through the connection conductor 50.

Then, the shielding layer 17 may be formed, and the example electronic device module 100' in FIG. 5 may be manufactured.

Figure 8:
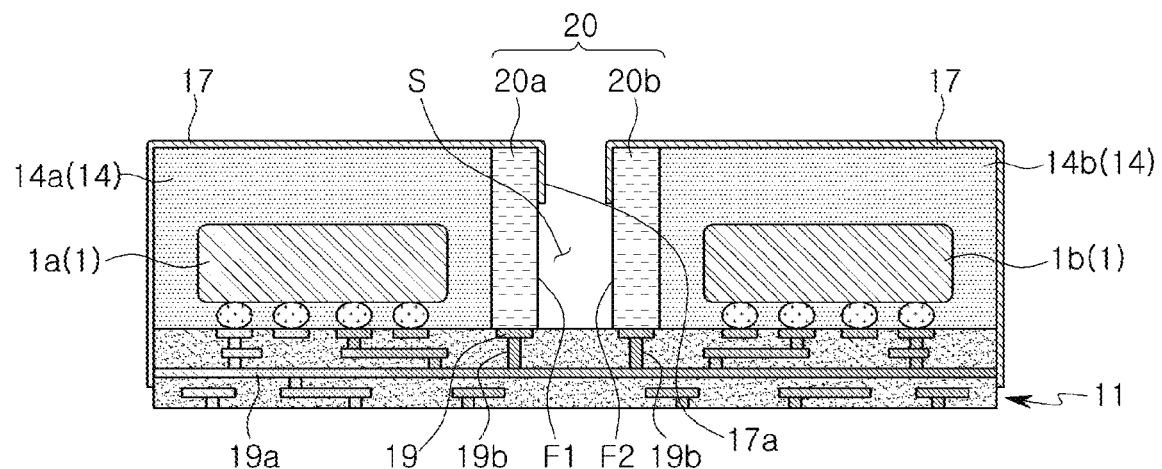
FIG. 8 is a cross-sectional view of an electronic device module according to one or more embodiments.

FIG. 8 is a cross-sectional view of an electronic device module according to one or more embodiments.

Referring to FIG. 8, in the electronic device module according to an example, a plurality of ground vias 19b may be provided inside a substrate 11.

The ground vias 19b may penetrate through an insulation layer of the substrate 11, and may electrically connect the connection electrode 19 with the ground layer 19a.

In the examples, the ground vias 19b may be disposed on a lower portion of the shielding wall 20, and the plurality of ground vias 19b may be consecutively disposed along a connecting surface of the shielding wall 20. In the case in which a width of the shielding wall 20 is wide, the ground vias 19b may be disposed on a lower portion of the shielding wall 20 in a plurality of columns.

In the case in which the ground vias 19b are configured as above, a first component 1a and a second component 1b may be disposed in a shielding structure formed by the shielding wall 20, the shielding layer 17, the ground layer 19a, the ground vias 19b, and the connection electrode 19.

Also, as the ground vias 19b disposed between the ground layer 19a and the connection electrode 19 form a shielding wall, an inflow of electromagnetic waves into the shielding structure or an outflow of electromagnetic waves from the shielding structure may be significantly reduced through an insulation layer between the ground layer 19a and the connection electrode 19.

Figure 9:
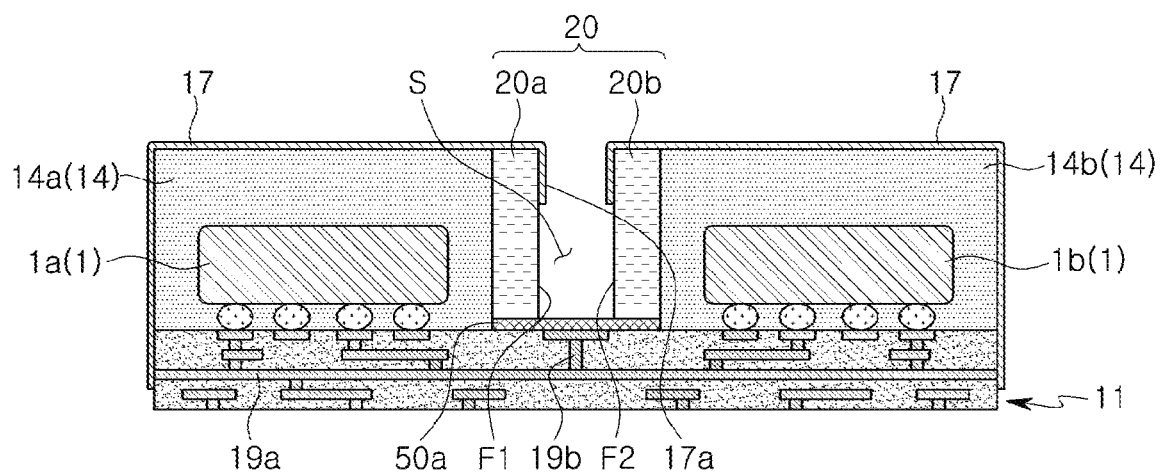
FIG. 9 is a cross-sectional view of an electronic device module according to one or more embodiments.

FIG. 9 is a cross-sectional view of an electronic device module according to one or more embodiments.

According to FIG. 9, in the electronic device module of the present examples, two shielding walls 20a and 20b may be connected to one connection conductor 50a.

Also, the connection conductor 50a may be connected to one connection electrode 19, and ground vias 19b may be disposed at a position facing a space S between a first wall 20a and a second wall 20b, not on a lower portion of the first wall 20a and the second wall 20b.

However, embodiments thereof are not limited thereto. As in the aforementioned examples, the connection conductor 50a may be disposed on the lower portions of the first wall 20a and/or the second wall 20b, or other various modifications may be possible.

Figure 10:
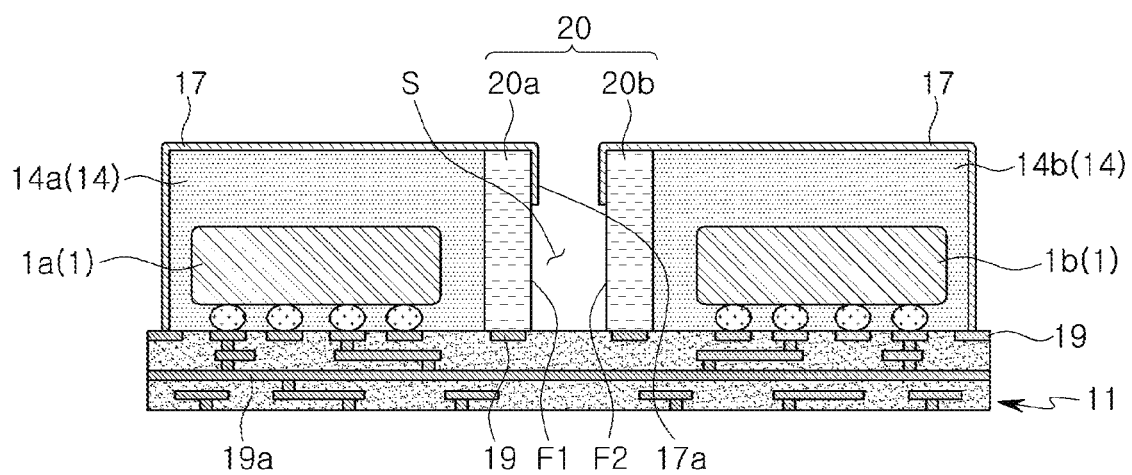
FIG. 10 is a cross-sectional view of an electronic device module according to one or more embodiments.

FIG. 10 is a cross-sectional view of an electronic device module according to one or more embodiments.

Referring to FIG. 10, in the electronic device module according to the present examples, a shielding layer 17 may be connected to a connection electrode 19 disposed on one surface of a substrate 11, not to a ground layer 19a on the substrate 11.

To achieve this, on one surface of the substrate 11, the connection electrode 19 may be disposed between a first component 1a and a second component 1b, as well as on an edge portion of the substrate 11.

Although not illustrated, the connection electrode 19 may be electrically connected to a ground of the substrate 11. Thus, the connection electrode 19 in the example may be electrically connected to ground terminals of electronic components 1 and the ground layer 19a.

The connection electrode 19 disposed between the first component 1a and the second component 1b may be connected to the connection electrode 19 disposed on an edge portion of the substrate 11. However, embodiments thereof are not limited thereto. In the case of forming the connection electrode 19 disposed between first component 1a and the second component 1b as a dummy electrode, the connection electrode 19 disposed between the first component 1a and the second component 1b may not be connected to the connection electrode 19 disposed on the edge portion, and only the connection electrode 19 disposed on an edge portion may be connected to a ground of the substrate 11.

Embodiments thereof are not limited to the aforementioned embodiments. For example, in the aforementioned embodiments, the example in which a shielding layer is partially formed on opposing surfaces of a shielding wall is suggested, but in the case in which the shielding walls are spaced apart from each other by a sufficient distance, the shielding wall may be formed on overall areas of the opposing surfaces of the shielding wall. Also, portions of each of the embodiments may be combined and implemented.

In the electronic device module according to the examples, a sealing portion may be divided into two portions using a shielding wall. Accordingly, a volume of the sealing portion may be significantly reduced, and thus, stress occurring between the sealing portion and the shielding wall may be reduced.

Also, as a space is disposed between two sealing portions, in the case in which the sealing portion or the shielding wall is thermally expanded, a volume may be expanded to the empty space. Accordingly, damage of the electronic device module caused by thermal expansion may be significantly reduced.

While specific examples have been shown and described above, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An electronic device module comprising:
   a substrate;
   at least one first component and at least one second component disposed on one surface of the substrate;
   a first sealing portion sealing the at least one first component and a second sealing portion sealing the at least one second component;
   a shielding wall disposed between the at least one first component and the at least one second component to block a flow of electromagnetic waves; and
   a shielding layer of a conductive material disposed along a surface formed by the first and second sealing portions and the shielding wall,
   wherein the shielding wall comprises a first wall and a second wall spaced apart from each other, and the shielding layer is partially formed on opposing surfaces of the first wall and the second wall.

2. The electronic device module of claim 1, wherein the substrate comprises a ground layer exposed to a side surface of the substrate, and wherein the shielding layer is extended to the side surface of the substrate and connected to the ground layer.

3. The electronic device module of claim 2, wherein the substrate comprises connection electrodes on the one surface, and the shielding wall is disposed on an upper portion of the connection electrodes.

4. The electronic device module of claim 3, wherein the substrate further comprises a ground via connecting the connection electrodes and the ground layer.

5. The electronic device module of claim 4, wherein the ground via comprises a plurality of ground vias disposed along the shielding wall in parallel.

6. The electronic device module of claim 3, further comprising a connection conductor disposed between the connection electrodes and the shielding wall.

7. The electronic device module of claim 3, wherein both the first wall and the second wall are connected to one of the connection electrodes.

8. The electronic device module of claim 1, wherein the first wall and the second wall are spaced apart from each other by a distance ranging from 20 μm to 300 μm.

9. The electronic device module of claim 1, wherein thicknesses of the first wall and the second wall are greater than a thickness of the shielding layer.

10. The electronic device module of claim 1, wherein the shielding layer comprises a material different from a material of the shielding wall.

11. An electronic device module comprising:
a substrate;
a shielding wall disposed on a surface of the substrate to divide the surface into a first region and a second region and configured to block a flow of electromagnetic waves; and
a shielding layer of a conductive material disposed on the shielding wall,
wherein the shielding wall comprises a first wall and a second wall spaced apart from each other in a direction to space the first region apart from the second region in the direction, and
wherein the shielding wall is partially covered by the shielding layer on opposing surfaces of the first wall and the second wall.

12. The electronic device module of claim 11, further comprising:
at least one first component and at least one second component disposed on the surface of the substrate in the first region and the second region, respectively;
a first sealing portion sealing the at least one first component and a second sealing portion sealing the at least one second component,
wherein the shielding layer is disposed along a surface formed by the sealing portions and the shielding wall, and
wherein the shielding wall is partially exposed externally of the shielding layer on the opposing surfaces of the first wall and the second wall.

13. The electronic device module of claim 12, wherein the first wall is integrated with the first sealing portion, and the second wall is integrated with the second sealing portion.

14. The electronic device module of claim 11, further comprising:
a first sealing portion sealing the first region and a second sealing portion sealing the second region,
wherein the shielding layer is disposed along a surface formed by the sealing portions and the shielding wall, and
wherein the shielding wall is partially exposed externally of the shielding layer on the opposing surfaces of the first wall and the second wall.

15. A method of manufacturing the electronic device module of claim 1, comprising:
disposing a first component and a second component on one surface of a substrate;
disposing a conductive member between the first component and the second component; and
dividing a first wall and a second wall by cutting the conductive member.

16. The method of claim 15, wherein the disposing a conductive member comprises forming a sealing portion sealing the first component and the second component on the one surface of the substrate, forming a trench by partially removing the sealing portion, and forming the conductive member by filling the trench with a conductive material.

17. The method of claim 16, further comprising:
forming a shielding layer on a surface formed by the sealing portion, the first wall, and the second wall.

18. The method of claim 15, wherein the disposing a conductive member comprises mounting a conductive member in a form of a metal frame between the first component and the second component, and forming a sealing portion sealing the first component, the second component, and the conductive member on the one surface of the substrate.

19. The electronic device module of claim 11, wherein the substrate comprises a ground layer exposed to a side surface of the substrate, and wherein the shielding layer is extended to the side surface of the substrate and connected to the ground layer.

20. The electronic device module of claim 11, further comprising an interface between the shielding layer and the shielding wall.

* * * * *